(12) United States Patent
Tuominen et al.

(10) Patent No.: US 8,062,537 B2
(45) Date of Patent: Nov. 22, 2011

(54) METHOD FOR MANUFACTURING AN ELECTRONICS MODULE

(75) Inventors: Risto Tuominen, Helsinki (FI); Antti Iihola, Helsinki (FI)

(73) Assignee: Imbera Electronics Oy, Espoo (FI)

( * ) Notice: Subject to any disclaimer, the term of this patent is extended or adjusted under 35 U.S.C. 154(b) by 581 days.

(21) Appl. No.: 11/667,429

(22) PCT Filed: Nov. 23, 2005

(86) PCT No.: PCT/FI2005/000499
§ 371 (c)(1),
(2), (4) Date: May 9, 2007

(87) PCT Pub. No.: WO2006/056643
PCT Pub. Date: Jun. 1, 2006

(65) Prior Publication Data
US 2007/0267136 A1    Nov. 22, 2007

(30) Foreign Application Priority Data
Nov. 26, 2004   (FI) ................................. 20041524

(51) Int. Cl.
*H01B 13/00* (2006.01)
*H05K 3/36* (2006.01)
(52) U.S. Cl. .......................................... 216/20; 29/830
(58) Field of Classification Search .............. 216/20; 257/E23.061, 678, 734; 438/107, 584, 128
See application file for complete search history.

(56) References Cited

U.S. PATENT DOCUMENTS

| | | |
|---|---|---|
| 4,246,595 A | 1/1981 | Noyori et al. |
| 5,302,851 A * | 4/1994 | Ree et al. .................. 257/702 |
| 5,838,545 A | 11/1998 | Clocher et al. |
| 6,232,666 B1 | 5/2001 | Corisis et al. |
| 6,242,282 B1 | 6/2001 | Fillion et al. |
| 6,271,469 B1 | 8/2001 | Ma et al. |
| 6,284,564 B1 | 9/2001 | Balch et al. |
| 6,475,877 B1 | 11/2002 | Saia et al. |

(Continued)

FOREIGN PATENT DOCUMENTS

FI    20030493 A    10/2004

(Continued)

*Primary Examiner* — Nadine G Norton
*Assistant Examiner* — Patti Lin
(74) *Attorney, Agent, or Firm* — Birch, Stewart, Kolasch & Birch, LLP

(57) ABSTRACT

Method for manufacturing an electronic module, which electronic module includes a component (6), which has contact areas (17), which are connected electrically to a conductor-pattern layer (14). The manufacture according to the method starts from a layered membrane, which comprises at least a conductor layer (4) and an insulator layer (10) on the first surface of the conductor layer (4). Contact openings (17), the mutual positions of which correspond to the mutual positions of the contact areas (7) of the component (6), and which penetrate both the conductor layer (4) and the insulator layer (10), are made in the membrane. After the manufacture of the contact openings (17), the component (6) is attached to the surface of the insulator layer (10), in such a way that the contact areas (7) of the component (6) line up next to the contact openings (17). After this, at least in the contact openings (17) and the contact areas (7) of the component (6) a conductor material is made, which connects the component (6) to the conductor layer (4) and the conductor layer (4) is patterned to form a conductor-pattern layer (14).

11 Claims, 4 Drawing Sheets

U.S. PATENT DOCUMENTS

Figure 1:
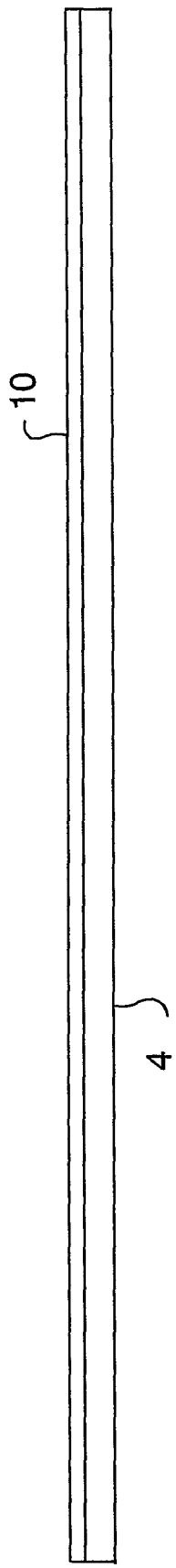

| | | | |
|---|---|---|---|
| 6,596,968 B2 * | 7/2003 | Yamamoto et al. | 219/121.71 |
| 7,294,529 B2 * | 11/2007 | Tuominen | 438/107 |
| 7,673,387 B2 * | 3/2010 | Tuominen et al. | 29/852 |
| 2002/0017711 A1 | 2/2002 | Kwon et al. | |
| 2003/0068852 A1 | 4/2003 | Towle et al. | |
| 2006/0278967 A1 | 12/2006 | Tuominen et al. | |

FOREIGN PATENT DOCUMENTS

| | | | |
|---|---|---|---|
| JP | 4-283987 A | | 10/1992 |
| JP | 2002-158307 A | | 5/2002 |
| WO | WO-03/065778 A1 | | 8/2003 |
| WO | WO03/065779 | * | 8/2003 |
| WO | WO-2004/089048 A1 | | 10/2004 |

* cited by examiner

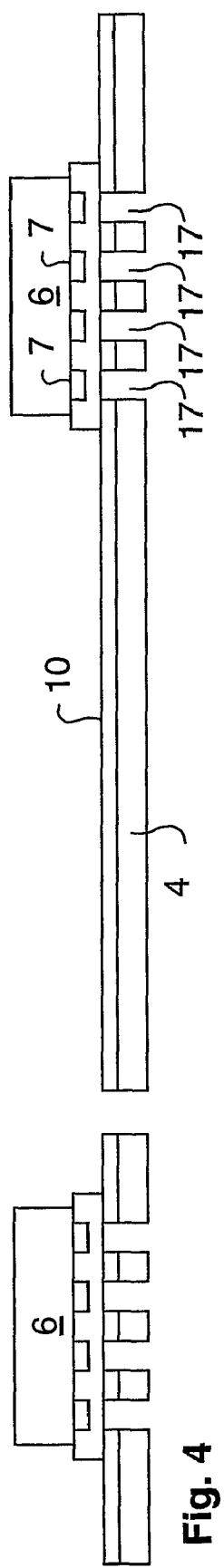
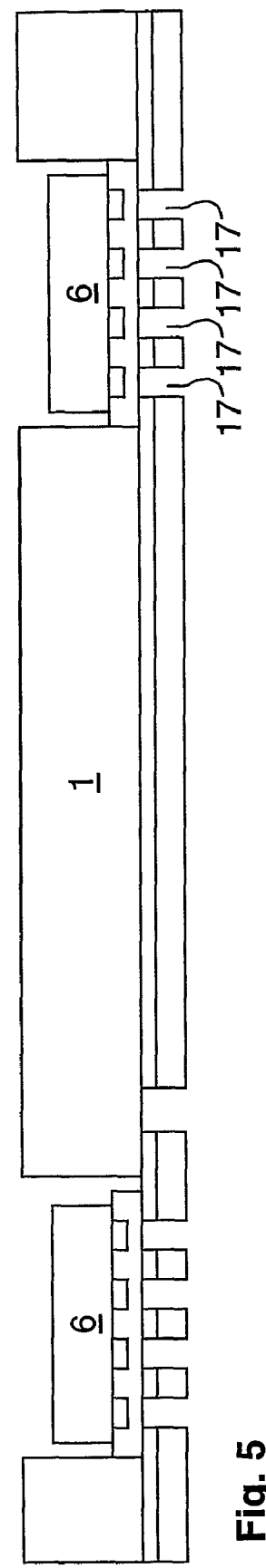

METHOD FOR MANUFACTURING AN ELECTRONICS MODULE

The present invention relates to a method for manufacturing an electronic module.

The invention particularly relates to a manufacturing method, in which one or more components are embedded in an installation base and connected to a conductor-pattern structure. The electronic module being manufactured can be a module like a circuit board, which contains several components, which are connected to each other electrically through conductor structures manufactured in the electronic module. The electronic module can contain microcircuits, to which several contact terminals are connected. In addition to, or instead of microcircuits, other components too, for example passive components, can be embedded in an installation base. The intention is thus to embed in the electronic module components that are typically attached uncased to a circuit board (to the surface of the circuit board). Another important component group consists of components that are typically encased for attachment to a circuit board. The electronic modules, to which the invention relates, can of course also include other kinds of components.

U.S. Pat. No. 6,284,564 B1 discloses a method for manufacturing an electronic module. In the method, manufacture is started from an insulating membrane. On one side of the insulating membrane an adhesive is spread, either in such a way that the adhesive is spread on the bare insulating membrane, or that conductor patterns are first made on the insulating membrane. After this, holes for vias are drilled in the insulating membrane. Holes are also drilled at the locations of the contact areas of the component to be attached to the electronic module. After this, the component is attached to the adhesive layer, aligned relative to the holes drilled in the contact areas. A conductor layer is grown in the drilled holes and on the free surface of the insulating membrane, and is patterned to form a conductor-pattern layer.

U.S. Pat. No. 6,475,877 B1 discloses another method for manufacturing an electronic module. Manufacture is started from a bare insulating membrane. The insulating membrane is first surface with a conductor surfacing and after this the conductor surface is patterned with opening at the contact areas of the component to be attached. After this, an adhesive is spread on the opposite side of the insulating membrane, with the aid of which the component is attached to the surface of the membrane, aligned with the aid of the openings patterned in the conductor surfacing. After this, holes are opened through the insulator and adhesive layers, at the opening patterned in the conductor surfacing. Metal, which is patterned to form a conductor-pattern layer, is grown in the openings and on top of the conductor surfacing. In the methods described above, the component is aligned either directly in the via (U.S. Pat. No. 6,284,564 B1) or both the component and the via are aligned with the aid of a fixed alignment mask formed in the conductor surfacing (U.S. Pat. No. 6,475,877 B1). For this reason, it can be assumed that there will be good alignment accuracy between the component, the via, and the conductor pattern. When attempting to manufacture small and reliable structures cost-effectively, the alignment of the component is an important factor. It should be possible to align the component very precisely and reliably, because wrongly aligned components will cause reliability problems and also reduce the yield, in which case the profitably of the manufacture of the modules will suffer.

The invention is intended to create a new method, by means of which components can be placed inside a circuit board or other electronic module. Further, the new method should, like the methods referred to above, permit the accurate alignment of the components.

The invention is based on starting manufacture from a layered membrane, which comprises at least a conductor layer and an insulator layer on the first surface of this. In addition, on the second surface of the conductor layer there can be a support layer, which can be of insulating or conductive material. After this, contact openings are made at locations corresponding to the future positions of the contact areas of the components. After this, the components are attached, aligned relative to the contact openings in the insulating layer, on the first surface of the conductor layer. The attachment can take place, for example, with the aid of an insulating adhesive. After this, electrical contacts between the conductor layer and the contact areas of the components are formed through the contact openings. After the electrical contacts are manufactured, conductor patterns are manufactured from the conductor layer.

More specifically, the method according to the invention is characterized by what is stated in claim 1.

The invention offers an alternative manufacturing method to the methods described above, which has advantageous properties in terms of certain applications.

In the method according to the invention, the basic material for the layered membrane can be selected, for example, to have a suitable stiffness in terms of the manufacturing process, irrespective of the thickness and material properties of the insulator layer. Unlike the solutions of the publications U.S. Pat. Nos. 6,284,564 B1 and 6,475,877 B1, this provides a possibility to select the thickness and material of the insulator layer to be optimal from the point of view of the electronic module being manufactured. In practise, the solutions of the above-mentioned publications require polyimide film to be used as the insulator layer.

Despite this, the stiffness of the layered membrane in the embodiments of the invention can also be selected to be optimal in terms of the manufacturing process. A suitable stiffness in the layered membrane can be achieved with the aid of the conductor layer, or, if necessary, a support membrane can be used.

For corresponding reasons, the thickness of the insulator layer in the embodiments of the invention can, if necessary, also be selected to be clearly thinner than when using the method disclosed in the publications referred to above. The component can, of course, also be glued directly to the surface of the conductor layer—without the insulating layer in between—but the use of an insulator layer can be considered to have some advantages, at least in the case of certain applications. First of all, air bubbles may remain in the adhesive layer, which may cause a source of faults, because in that case insulating material may be lacking between the conductor layer and the component. Air bubbles can also lead to an undesired etching result in processes using chemical etching. In addition, with the aid of a suitably chosen, ready-made insulator layer it is possible to achieve a better adhesion in the conductor layer than with an adhesive.

In the embodiments, it is also possible to use such an insulating layer on the surface of the conductor layer, which has itself an adhesion property in the direction of the component. In that case, there will be no need for a separate gluing stage and the manufacturing process will be simplified. Using such an embodiment, at least in some cases it will be possible to achieve more economical manufacturing costs and a better yield.

Further, there is the difference from the solutions disclosed in the publications U.S. Pat. Nos. 6,284,564 B1 and 6,475,877

B1 that the layered membrane that is the basic material already contains a conductor layer of a substantial thickness, so that the conductor material demanded in the conductor-pattern layer will not necessarily need to be introduced to the module blank in connection with the metallization of the contact openings. Thus, it will also be possible to use such contact-opening metallization or filling methods, which do not increase the conductor material on flat surfaces very much, or do not increase it at all. The use of electrochemical growing, on the other hand, achieves the advantage that there is no need to make a conductive surfacing on the surface of the insulator layer in order to create a counter-electrode.

In one embodiment of the invention, an adhesive layer is only used in the area between the component and the insulator layer, so that the consumption of adhesive can be reduced, compared to the methods disclosed in the aforementioned publications.

In the following, the invention is examined with the aid of examples and with reference to the accompanying drawings.

Figure 2:
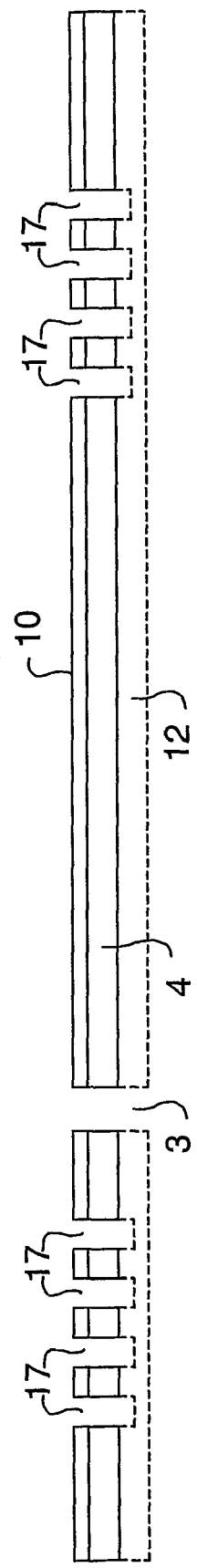
Figure 3:
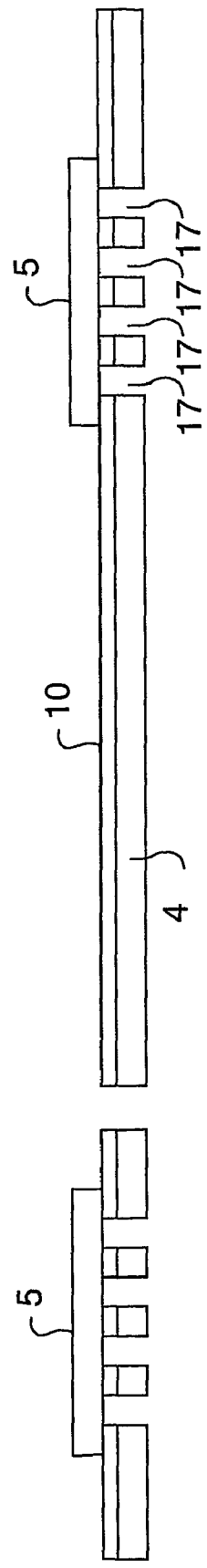
Figure 6:
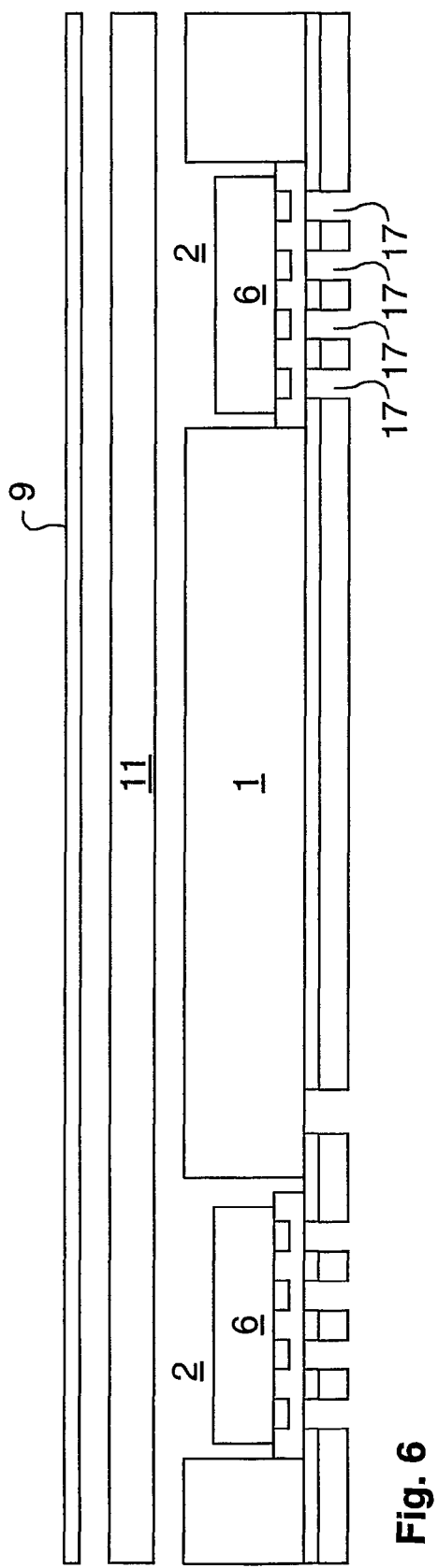
Figure 7:
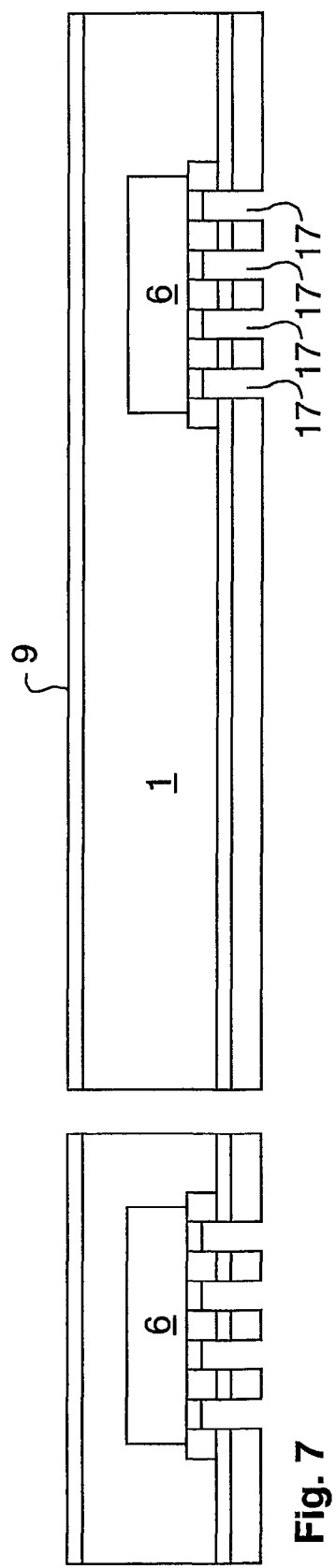
Figure 8:
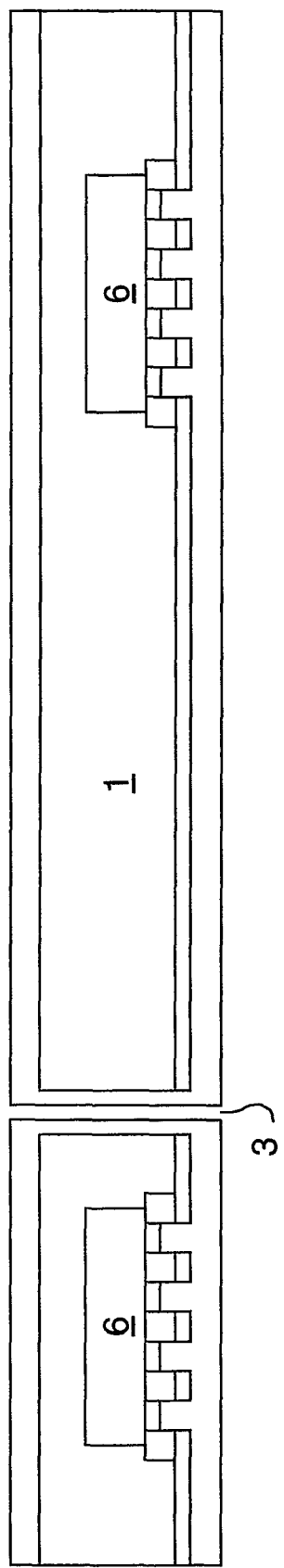
Figure 9:
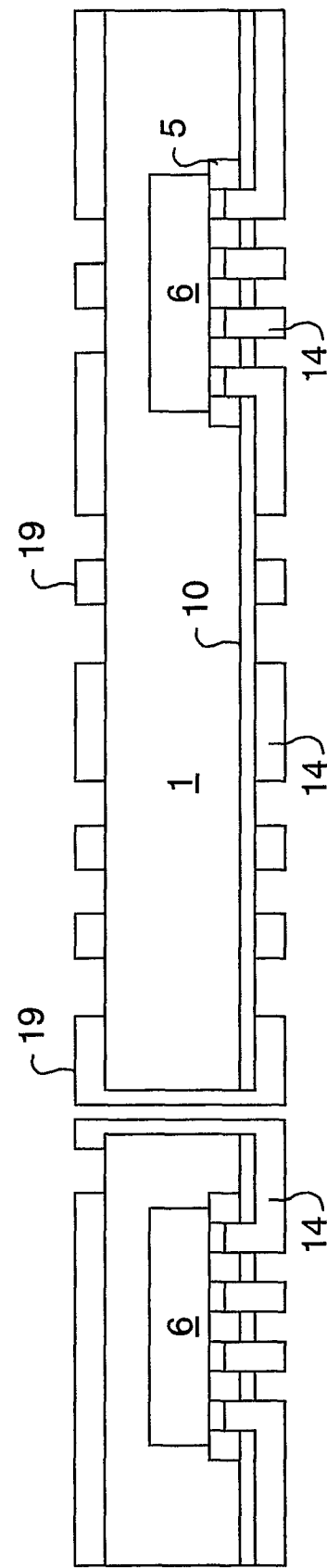

FIGS. 1-9 show a series of cross-sections of manufacturing methods according to one embodiment.

In the methods according to the embodiments, manufacturing can commence, for example, from a bare conductor layer 4, which can be, for example, a layered membrane formed of a metal layer and an insulator layer 10. One applicable manufacturing material for the conductor layer 4 is, for example, copper foil (Cu). If the conductor layer 4 selected for the process is very thin, or if the conductor layer is not mechanically durable for other reasons, it is recommended that the conductor layer 4 be supported with the aid of a support layer 12. The support layer 12 can be, for example, an electrically conductive material, such as aluminium (Al), steel, or copper, or an insulating material, such as a polymer.

The insulator layer 10 can be, for example, a polymer, such as an epoxy. The thickness of the insulating is typically less than 200 micrometres, for example 1-20 micrometres and preferably less than 10 micrometres. When manufacturing thin electronic modules, at suitable thickness for the insulating layer will be typically in the range from about 4 to about 7 micrometres.

The layered membrane can be manufactured by using manufacturing methods that are well known in the circuit-board industry. The layered membrane can be manufactured, for example, by laminating the layers together.

Before the attachment of the component 6 to the layered membrane, contact openings 17 are made in the conductor layer 4 and the insulator layer 10 at the positions of the contact areas 7 of the component 6. The contact openings 17 can be made, for example, by drilling with the aid of a laser. The mutual positions of the contact openings 17 are selected according to the mutual positions of the contact areas 7 of the component while the location and position of each group of contact openings are selected in such a way that the component will be positioned correctly relative to the entire electronic module. Thus, typically one contact opening 17 is made for each contact area 7 participating in the creation of an electrical contact. The surface area of the contact openings 17 being manufactured can be more or less as great as the surface area of the corresponding contact area 7. Of course, the surface area of the contact opening 17 can also be chosen to be smaller, or in some embodiments slightly larger than the surface area of the corresponding contact area 7. If the surface area of the contact area 7 is very large, several contact openings can be manufactured for each contact area.

The contact openings 17 can be drilled from the direction of the first or second surface. If a support layer 12 is used in the embodiment, and is thus on the second surface of the conductor layer, it can be advantageous to drill the contact openings 17 from the direction of the first surface, because in that case the openings to be drilled do not need to penetrate the support layer 12 entirely. In such an embodiment, the contact openings 17 open later, when the support layer 12 is detached. The contact openings can also be opened in such a way that the material layer formed by the conductor layer 4 and the support layer 12 is thinned by etching from the direction of the support layer. The conductor layer 4 and the support layer 12 can also be formed from a single material layer. In that case, the part of the material layer corresponding to the support layer 12 is removed and the contact openings 17 open. The contact opening 17 is thus intended to extend through the entire conductor layer 4.

The components 6 are attached to the surface of the insulator layer 10 with the aid of an adhesive. For gluing, an adhesive layer 5 is spread on the attachment surface of the insulating layer 10, or on the attachment surface of the component 6, or on the attachment surfaces of both. After this, the components 6 can be aligned to the positions planned for the components 6, with the aid of the contact areas 17, the holes 3, or other alignment marks made in the base.

Instead of glue, it is also possible to use a suitable tape or other adhesive to attach the component 6. It is also possible for the insulating layer 10 itself to have a sufficient adhesive ability to hold the component in place for at least until the component is secured in place with the aid of the insulating-material layer 1. In that case no separate glue or tape will be required.

The term attachment surface of the component 6 refers to that surface of the component 6, which faces towards the insulator layer 10. The attachment surface of the component 6 comprises contact areas, through which an electrical contact can be formed to the component. The contact area can be, for example, flat areas on the surface of the component 6, or more usually contact protrusions protruding from the surface of the component 6. There are generally at least two contact areas or protrusions in the component 6. In complex microcircuits, there can be a great many contact areas.

In many embodiments, it is preferable to spread so much adhesive on the attachment surface or attachment surfaces that the adhesive fills the space remaining between the component 6 and the insulator layer 10. In that case, a separate filler agent will not be required. Filling the space remaining between the components 6 and the insulator layer 10 reinforces the mechanical connection between the component 6 and the insulator layer 10, so that a mechanically more durable construction will be achieved. During gluing, adhesive will also enter the contact openings 17.

The term adhesive refers to a material, by means of which the components are attached to the insulator layer 10. One property of the adhesive is that the adhesive can be spread on the surface of the insulator layer and/or of the component in a relatively liquid form, or in one that otherwise conforms to the surface shapes, for example, in the form of a membrane. Another property of the adhesive is that after spreading the adhesive hardens or can be hardened at least partly, in such a way that the adhesive can hold the component in place (relative to the insulator layer 10) at least until the component is attached to the construction in some other way. A third property of the adhesive is its adhesive ability, i.e. its ability to adhere to the surface being glued.

The term gluing refers to attaching the component and the insulator layer 10 to each other with the aid of an adhesive. In gluing, the adhesive is thus brought between the component and the insulator layer 10 and the component is placed in a suitable position relative to the insulator layer 10, in which the adhesive is in contact with the component and the insulator layer 10 and at least partly fills the space between the component and the insulator layer 10. After this, the adhesive is allowed to harden (at least partly), or the adhesive is actively cured (at least partly), in such a way that the component is attached to the insulator layer 10 with the aid of the adhesive. In some embodiments, the contact protrusions of the component may, during the gluing, protrude through the adhesive layer and even extend to the contact openings 17.

The adhesive used in the embodiments is, for example, a thermally hardening epoxy. The adhesive is selected in such a way that the adhesive being used has sufficient adhesion to the insulator layer 10 and the component. One preferred property of the adhesive is a suitable thermal expansion coefficient, so that during the process the thermal expansion of the adhesive will not differ too greatly from that of the surrounding material. The adhesive selected should also preferably have a short hardening time, preferably of a few seconds at most. In this time the adhesive should harden at least partly, so that the adhesive will be able to hold the component in place. The final hardening can take clearly more time and can indeed be planned to take place in connection with a later process stage. The adhesive should also withstand the process temperatures used, for example, heating to a temperature of 100-265° C. a few times, and other manufacturing-process strain, for example, chemical or mechanical strain. The adhesive preferably has an electrical conductivity that is of the same order as that of insulating materials.

A suitable insulating-material layer 1 is selected as the base material of the electronic module, for example, a circuit board. The insulating-material layer 1 can be, for example, a polymer base, such as a glass-fibre-reinforced epoxy sheet FR4. Other examples of suitable materials for the insulating-material layer 1 are PI (polyimide), FR5, aramid, polytetrafluoroethylene, Teflon®, LCP (liquid crystal polymer), and a precured binder layer, i.e. prepreg.

Using a suitable method, recesses or vias, selected according to the size and mutual position of the components 6 glued to the insulator layer 10, are made in the insulating-material layer 1. The recesses or vias can also be made slightly larger than the components 6, in which case the alignment of the insulating-material layer 1 relative to the insulator layer 10 and the components 6 will not be so critical. If in the process an insulating-material layer 1, in which vias are made for the components 6, is used, certain advantages can be gained by using additionally a separate insulating-material layer 11, in which holes are not made. Such an insulating-material layer 11 can be located on top of the insulating-material layer 1, to cover the vias made for the components.

The insulating-material layer 1 can also be made in such a way that insulating material in a liquid form is spread on top of the insulator layer 10 and the component 6, or a partly unhardened insulating-material sheet is placed on them. After this, the insulating material is cured, which creates the insulating-material layer 1.

If a second conductor layer is desired in the electronic module being manufactured, this can be made, for example, on the surface of the insulating-material layer 1. In embodiments, in which a second insulating-material layer 11 is used, the conductor layer can be made on the surface of this second insulating-material layer 11. Conductor patterns 19 can be made from the second conductor layer 9. The conductor layer 9 can be made, for example, in a similar manner to the conductor membrane 4. However, it is not necessary to made a second conductor membrane 9 in simple embodiments and when making simple electronic modules. A second conductor membrane 9 can, however, be exploited in many ways, such as an additional space for conductor patterns and components 6 and protecting the entire module from electromagnetic radiation (EMC protection). A second conductor membrane 9 can also be used to reinforce the structure and reduce, for example, warping of the module.

Vias are made in the electronic module, through which electrical contacts can be formed between the contact areas of the components 6 and the conductor layer 4. For the making of the vias, the contact openings 17 are cleaned of adhesive and other materials that may have entered the openings. This is naturally performed from the direction of the second surface of the conductor material 4, as the components are glued to the first surface. In connection with the cleaning of the contact openings, it is also possible to clean the contact areas 7 of the components 6, which will further improve the preconditions for the manufacture of a high-quality electrical contact. Cleaning can take place, for example, using plasma technology, chemically, or with the aid of a laser. If the contact openings 17 and the contact areas are already sufficiently clean, cleaning can naturally be omitted.

After cleaning, it is also possible to check the success of the alignment of the component 6, as the contact areas 7 of a correctly aligned component will appear through the contact openings 17, when viewed from the direction of the conductor layer 4.

The success of the alignment of the component 6 can also be checked prior to cleaning, if the adhesive does not fill the contact openings 17, the adhesive is transparent, or if the conductor layer 4, the insulator layer 10, and the possible support layer 12 are so thin that the contact areas 7 or the component can be seen through the layers. Checking is easiest when a transparent adhesive is used.

After this, a conductor material is brought to the holes 17, in such a way that an electrical contact is formed between the components 6 and the conductor layer 4. The conductor material can be made, for example, by filling the contact openings with an electrically conductive paste. The conductor material can also be made using one of the several growing methods known in the circuit-board industry. At present, the best electrical contacts are made by forming a metallurgical joint, for example, by growing the conductor material using a chemical or electrochemical method. The intention is thus to always use such methods, at least in the most demanding embodiments. One good alternative is to grow a thin layer using a chemical method and to continue the growth with a more economical electrochemical method. In addition to these methods, it is of course also possible to use some other method, which is advantageous in terms of the final result.

In the following, some possible embodiments will be examined in greater detail, with the aid of the procedural stages shown in FIGS. 1-9.

Stage A (FIG. 1):

In stage A, a suitable layered membrane, which comprises a conductor layer 4 and an insulator layer 10 on the first side of the conductor layer 4, is selected as the starting material for the process. A layered membrane, in which a support layer 12 is on one surface of the conductor layer 4, can also be selected as the starting material. The support layer 12 is optional and is shown by a broken line and only in FIG. 2. The layered membrane can be manufactured, for example, by taking a support base 12 suitable for processing and attaching a suitable conductor membrane to the surface of this support base 12, to create a conductor layer 4, as well as an insulator membrane to create the insulator layer 10.

The support base 12 can be, for example, of an electrically conductive material, such as aluminium (Al), or of an insulating material, such as a polymer. The conductor layer 4 can be created, for example by attaching thin metal foil to one surface of the support base 12, for example, by laminating it from copper (Cu). The metal foil can be attached to the support base, for example, by using an adhesive layer, which is spread on the surface of the support base 12 or metal foil, prior to the lamination of the metal layer. At this stage, there need be no patterns in the metal foil.

The insulator layer 10, can in turn be of epoxy, for example.

Stage B (FIG. 2):

Contact openings 17 are made form the vias required by the electrical contacts of the components. The contact openings 17 are made through the insulator layer 10 and the conductor layer 4, for example, with a laser or mechanically by drilling. In the embodiment of the figure, the contact openings 17 are drilled form the direction of the first surface of the conductor layer and extend to the material of the support layer 12. In the embodiment of the figure, a via 3, which can be used as an aid in aligning, is made in addition to the contact openings 17.

Stage C (FIG. 3):

In stage C, an adhesive layer 5 is spread on top of the insulator layer 10, in the areas to which the components 6 are to be attached. These areas can be termed connection areas. The adhesive layers 5 can be aligned, for example, with the aid of the contact openings 17. The thickness of the adhesive layer is selected in such a way that the adhesive completely fills the space between the component 6 and the insulator layer 10, when the component 6 is pressed onto the adhesive layer 5. If the component 6 includes contact protrusions 7, the thickness of the adhesive layer 5 should be greater, for example, about 1.1-10 times, than the height of the contact protrusions 7, so that the space between the component 6 and the insulator layer 10 will be well filled. The surface area of the adhesive layer 5 formed for the component 6 can also be slightly greater than the corresponding surface area of the component 6, which will also help to reduce the risk of inadequate filling.

Stage C can be modified in such a way that the adhesive layer 5 is spread on the connector surfaces of the components 6, instead of on the connector areas of the insulator layer 10. This can be performed, for example, in such a way that the component is dipped in adhesive before it is assembled in place in the electronic module. It is also possible to proceed by spreading the adhesive on both the connector areas of the insulator layer 10 and on the connector surfaces of the components 6.

The adhesive used is thus an electrical insulator, so that electrical contacts between the contact areas 7 of the components 6 do not arise in the adhesive layer 5 itself.

Stage D (FIG. 4):

In stage D, the components 6 are set in place in the electronic module. This can be done, for example, by using the aid of an assembly machine to press the components 6 into the adhesive layer 5. In the assembly stage, it is possible to proceed in the manner disclosed in the publications U.S. Pat. Nos. 6,284,564 B1 and 6,475,877 B1, while it is in any case possible to align the components 6 equally accurately in place with the aid of the contact openings 17. In more approximate alignment, it is also possible to use the vias 3 or other available alignment marks, if such have been made in the board.

The components 6 can be glued singly, or in suitable groups. The typical procedure is for the module blank to be brought to a suitable position relative to the assembly machine, after which the component 6 is aligned and pressed onto the module blank, which is held stationary during alignment and attachment.

Stage E (FIG. 5):

An insulating-material layer 1, in which there are ready made holes 2 or recesses for the glued components 6, is placed on top of the insulator layer 10. The insulating-material layer 1 can be manufactured from a suitable polymer base, in which holes or recesses, selected according to the size and position of the components 6, are made using some suitable method. The polymer base can be, for example, a pre-preg base, which is known and widely used in the circuit-board industry.

It is best to perform stage E only after the adhesive layer 5 has been cured, or otherwise hardened sufficiently for the components 6 to remain in place while the insulating-material layer 1 is set in place.

The insulating-material layer 1 can also be made in such a way that a sheet of insulating material, which is hardened later, with no holes in it is placed on top of the component and the insulator layer 10. Such a sheet can be, for example, suitably selected prepreg. The insulating-material layer 1 can also be made in such a way that an insulating material, which is later hardened, is spread in a liquid form on top of the component and the insulator layer 10.

Stage F (FIG. 6):

In stage F, an unpatterned insulating-material layer 11 is set on top of the insulating-material layer 1 and then a conductor layer 9 is set on top of it. Like the insulating-material layer 1, the insulating-material layer 11 can be manufactured from a suitable polymer membrane, for example, from the aforementioned pre-preg base. The conductor layer 9 can be, for example, copper foil, or some other membrane suitable for the purpose.

Stage F is advantageous in embodiments, in which the insulating-material layer 1 contains open holes 2 around the components 6 and also if it is desired to attach a conductor layer 9 to the opposite side of the insulating-material layer 1. The insulating material 11 will then fill the openings 2 of the components and secure the conductor layer 9 and the insulating-material layer 1 to each other. It is also possible to proceed in such a way that the openings 2 are filled with a separate filler. The second conductor layer 9 can also be attached directly against the insulating-material layer 1, before the layer 1 is cured.

Stage F is thus advantageous in some embodiments, but in most embodiments can just as well be omitted or replaced with another kind of procedure.

Stage G (FIG. 7):

In this stage, the layers 1, 11, and 9 are pressed with the aid of heat and pressure; in such a way that the polymer (in the layers 1 and 11) forms a unified and tight layer around the components 6 between the conductor layers 4 and 9. This procedure makes the second conductor layer 9 quite even and flat.

When manufacturing simple electronic modules including a single conductor pattern layer 14, stage F can even be entirely omitted, or the layers 1 and 11 can be laminated to the structure without the conductor layer 9.

Stage G is thus closely related to stage F, so that the modifications presented above in connection with stage F also concern stage G.

If the layered membrane includes a support layer 12, the support layer 12 can be detached or otherwise removed from the structure in this stage. The removal can be performed, for example, mechanically or by etching.

In an embodiment, in which there is a thick unified conductor layer (4 and 12 together) on the surface of the insulating-material layer 1, a portion of the conductor layer corresponding to the support layer 12 can be etched away. In this way it is possible to open the contact openings 17 on the second side of the conductor layer 4. The contact openings 17 will then, however, be generally filled with adhesive 5.

After this, the contact openings 17 are cleaned of adhesive using a suitable method, for example, chemically, by a laser, or by plasma etching. At the same time, the contact areas 7 of the component, which are located on the "bottom" of the contact openings 17, are also cleaned.

In this stage, if it is so wished, other holes, for example, a hole 3 through the insulating-material layer 1 for a via, can also be made.

Stage H (FIG. 8):

In stage H, conductor material is grown in the contact openings 17. In the example process, the conductor material is grown at the same time also elsewhere on top of the base, thus increasing the thickness of the insulating layers 4 and 9 too. If desired, conductor material can also be grown in the hole 3.

The conductor material to be grown can be, for example, copper, or some other sufficiently electrically conductive material. The selection of the conductor material takes into account the ability of the material to form an electrical contact with the material of the contact protrusions 7 of the component 6. In one example process, the conductor material is mainly copper. The copper metallizing can be performed by depositing a thin layer of chemical copper in the holes 17, after which plating is continued using an electrochemical copper-growing method. Chemical copper is used in the example because it will also form a deposit on top of the adhesive and act as an electrical conductor in electrochemical plating. The metal can thus be grown using a wet-chemical method, so that the growing is cheap and the conductor structure is of good quality.

Stage H is intended to form an electrical contact between the component 6 and the conductor layer 4. Thus, in stage H it is not essential to increase the thickness of the conductor layers 4 and 9, but instead the process can equally well be designed so that in stage H the holes 17 are only filled with a suitable material. The electrical contact can be made, for example, by filling the contact openings 17 with an electrically conductive paste, or by using some other suitable microvia metallizing method.

Stage I (FIG. 9):

In stage I, the desired conductor patterns 14 and 19 are made from the conductor layers 4 and 9 on the surfaces of the base. If in the embodiment only the conductor layer 4 is used, the patterns are formed only on one side of the base. It is also possible to proceed by forming conductor patterns only from the conductor layer 4, even though a second conductor layer 9 is used in the embodiment. In such an embodiment, the unpatterned conductor layer 9 can act, for example, as a layer that supports or protects the electronic module mechanically, or as protection against electromagnetic radiation.

The conductor patterns 14 can be made by removing the conductor material of the conductor layer 4 from outside the conductor patterns. The conductor material can be removed, for example, using some of the patterning and etching methods that are widely used and well known in the circuit-board industry.

After stage I, the electronics module includes a component 6, or several components 6, as well as conductor patterns 14 and 19 (in some embodiments, only the conductor patterns 14), with the aid of which the component 6, or components can be connected to an external circuit, or to each other. The preconditions then exist for manufacturing an operational totality. The process can thus be designed in such a way that the electronic module is ready after stage I and FIG. 9 indeed shows an example of one possible electronic module. If desired, the process can also be continued after stage I, for example, by coating the electronic module with a protective agent, or by manufacturing additional conductor pattern layers on the first and/or second surface of the electronic module.

The examples of the above series of figures show some possible processes, with the aid of which our invention can be exploited. However, our invention is not restricted only to the processes described above, but instead the invention also covers other various processes and their end products, taking into account the full scope and equivalence interpretation of the Claims. The invention is also not restricted to only the constructions and methods shown by the examples, but instead it will be obvious to one versed in the art that the various applications of our invention can be used to manufacture very many different kinds of electronic modules and circuit-boards, which differ even greatly from the examples described above. The components and circuits of the figures are thus shown only for the purpose of illustrating the manufacturing process. Thus many alterations can be made to the processes of the examples described above, without, however, deviating from the basic idea according to the invention. The changes can relate, for example, to the manufacturing techniques described in the different stages, or to the mutual order of the process stages.

The invention claimed is:

1. Method for manufacturing an electronic module, which electronic module includes a component, which has at least one contact area, which is connected electrically to a conductor-pattern layer, the method comprising:
    taking a layered membrane, which comprises at least a conductor layer and an insulator layer on the first surface of the conductor layer,
    making contact openings in the conductor layer, the mutual positions of which correspond to the mutual positions of the contact areas of each component to be connected and which penetrate both the conductor layer and the insulator layer,
    after the manufacture of the contact openings, attaching each component to the surface of the insulator layer of the layered membrane, positioned such that the contact areas of the component become aligned on the corresponding contact openings,
    making, at least in the contact openings and the contact areas of the component, a conductor material that connects the component to the conductor layer, and
    patterning the conductor layer to form the conductor-pattern layer after making the conductor material which connects the component to the conductor layer,
    wherein the making of the conductor material comprises first growing a thin layer of metal using a chemical growing method and then continuing the growth using an electrochemical growing method.

2. Method according to claim 1, wherein, before the contact openings are made, the layered membrane consists of a conductor layer and an insulator layer on the first surface of the conductor layer.

3. Method according to claim 1, wherein, before the contact openings are made, the layered membrane comprises a support layer on the second surface of the conductor layer.

4. Method according to claim 1, wherein, before the contact openings are made, the conductor layer of the layered membrane contains essentially all the conductor material, from which the conductor-pattern layer is later created.

5. Method according to claim 1, wherein the insulator layer of the layered membrane is of epoxy.

6. Method according to claim 1, wherein the thickness of the insulator layer of the layered membrane is less than 10 micrometres.

7. Method according to claim 1, wherein the component is attached to the insulator layer by an insulating adhesive.

8. Method according to claim 1, further comprising manufacturing a second conductor-pattern layer in the electronic module.

9. Method according to claim 1, wherein more than one component is placed in the electronic module and the embedded components are connected electrically to each other in order to create an operational totality.

10. Method according to claim 1, wherein at least one component to be attached to the conductor layer is an unpacked microcircuit chip.

11. Method for manufacturing an electronic module, which electronic module includes a component, which has a plurality of contact areas electrically connected to a conductor-pattern layer, the method comprising:

providing a layered membrane comprising a conductor layer and an insulator layer containing epoxy, the conductor layer having a first surface and a second surface and the insulator layer being located on the first surface of the conductor layer, the conductor layer further including contact openings located according to the mutual positions of the contact areas;

positioning the component such that the contact areas of the component become aligned on the respective contact openings;

attaching the component to the surface of the insulator layer of the layered membrane by means of an insulating adhesive containing epoxy;

cleaning the contact openings to expose the contact areas;

chemically depositing a first layer of copper in the contact openings and the contact areas of the component as well as on the second surface of the conductor layer, the first layer of copper electrically connecting the contact areas of the component to the conductor layer;

electrochemically plating a second layer of copper on said first layer of copper; and patterning the conductor layer to form the conductor-pattern layer after making the first layer of copper electrically connecting the contact areas of the component to the conductor layer.

* * * * *